United States Patent
Cho et al.

(10) Patent No.: US 10,854,143 B2
(45) Date of Patent: Dec. 1, 2020

(54) ORGANIC LIGHT-EMITTING DISPLAY DEVICE AND METHOD OF DRIVING THE SAME

(71) Applicant: Samsung Display Co., Ltd., Yongin-si (KR)

(72) Inventors: Dae Youn Cho, Yongin-si (KR); Tae Young Kim, Seongnam-si (KR); Hee Jin Kim, Hwaseong-si (KR); Jong Woo Park, Seongnam-si (KR); Young Tae Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/240,515

(22) Filed: Jan. 4, 2019

(65) Prior Publication Data

US 2019/0213958 A1    Jul. 11, 2019

(30) Foreign Application Priority Data

Jan. 10, 2018   (KR) .................. 10-2018-0003249

(51) Int. Cl.
| | | |
|---|---|---|
| G09G 3/3291 | (2016.01) | |
| G09G 3/3266 | (2016.01) | |
| G09G 3/3233 | (2016.01) | |
| G09G 3/3258 | (2016.01) | |
| H01L 27/32 | (2006.01) | |

(52) U.S. Cl.
CPC ......... *G09G 3/3291* (2013.01); *G09G 3/3233* (2013.01); *G09G 3/3258* (2013.01); *G09G 3/3266* (2013.01); *H01L 27/3276* (2013.01); *G09G 2300/043* (2013.01); *G09G 2300/0426* (2013.01); *G09G 2300/0439* (2013.01); *G09G 2300/0861* (2013.01); *G09G 2310/0251* (2013.01); *G09G 2310/0262* (2013.01); *G09G 2310/08* (2013.01); *G09G 2320/0233* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0249034 A1* | 10/2011 | Nagai | ................. | G09G 3/3426 345/690 |
| 2011/0267379 A1* | 11/2011 | Kurabayashi | ........ | G09G 3/3426 345/690 |
| 2013/0127923 A1* | 5/2013 | An | ........................ | G09G 5/10 345/690 |
| 2016/0275842 A1* | 9/2016 | Seok | .................... | G09G 3/3233 |

* cited by examiner

*Primary Examiner* — Robin J Mishler
(74) *Attorney, Agent, or Firm* — Lewis Roca Rothgerber Christie LLP

(57) ABSTRACT

An organic light-emitting display device includes a display unit having a plurality of pixel units. The display device also includes a timing controller for calculating a black bias pixel ratio (BBPR) of the display unit based on image signals provided by an external source and for generating a control signal based on the BBPR. The BBPR is the ratio of a number of pixel units in a black state to a total number of pixel units. A power supply unit provides a driving voltage to the display unit based on the control signal from the timing controller, wherein the power supply unit provides a first driving voltage to the display unit when the BBPR is less than a reference value and provides a second driving voltage, which is higher than the first driving voltage, otherwise.

18 Claims, 16 Drawing Sheets

FIG. 5
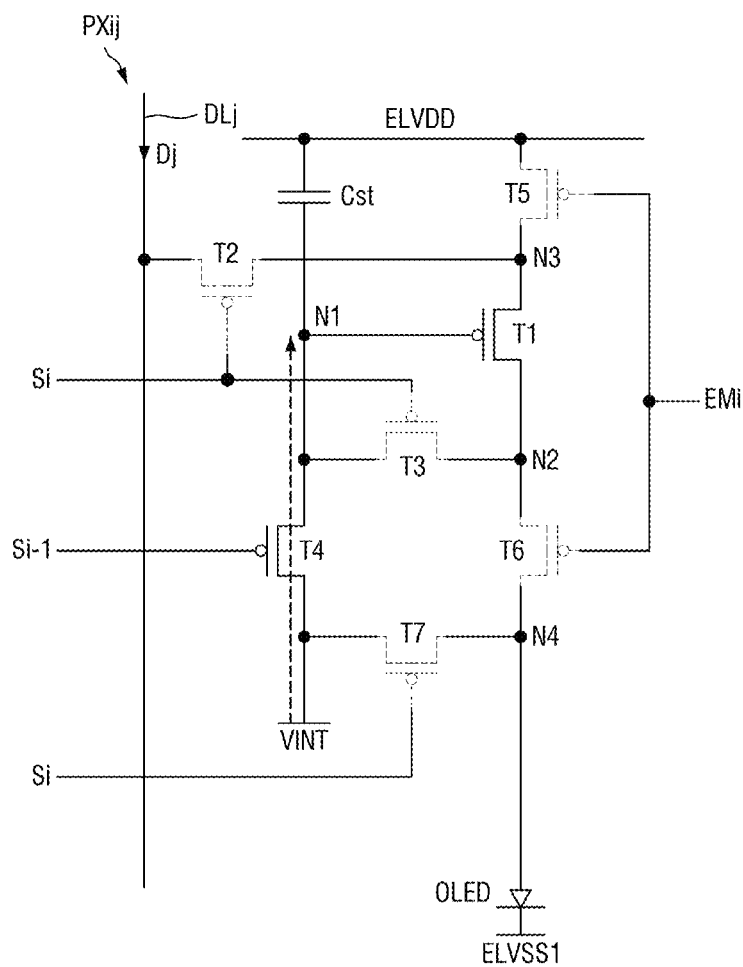
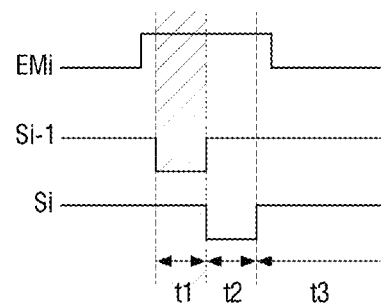

FIG. 6
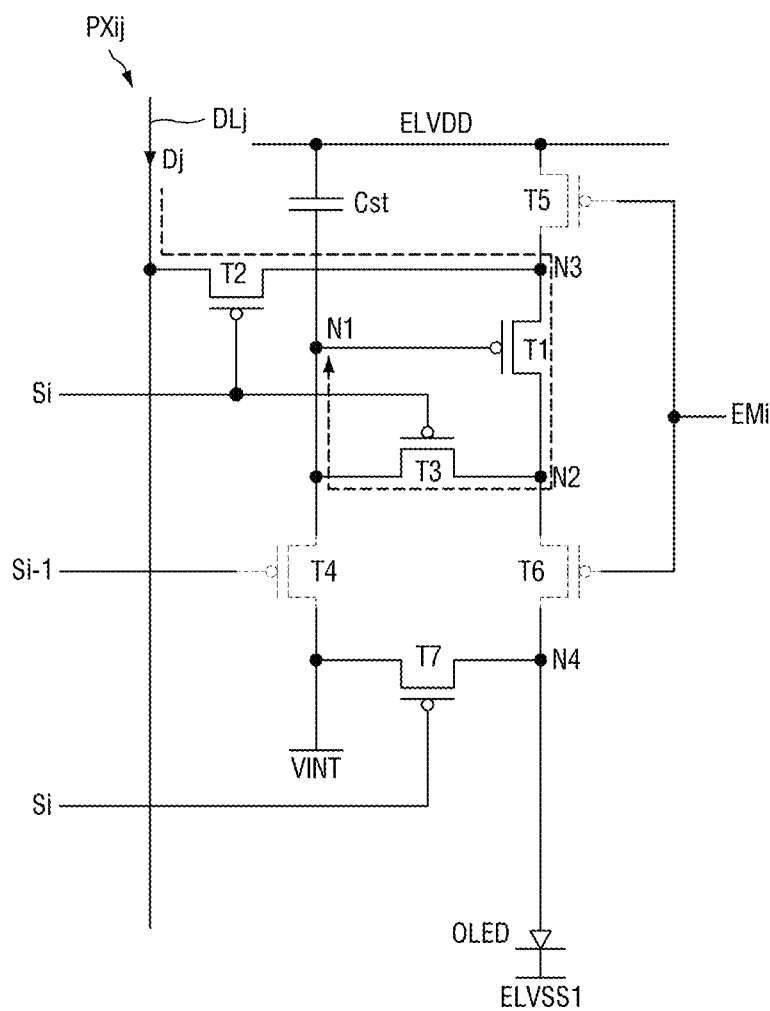
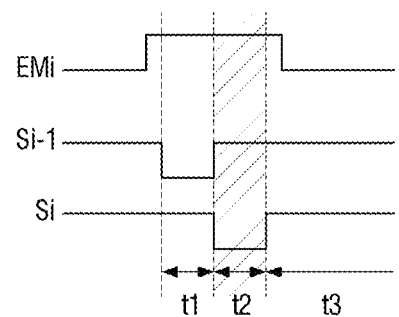

FIG. 7
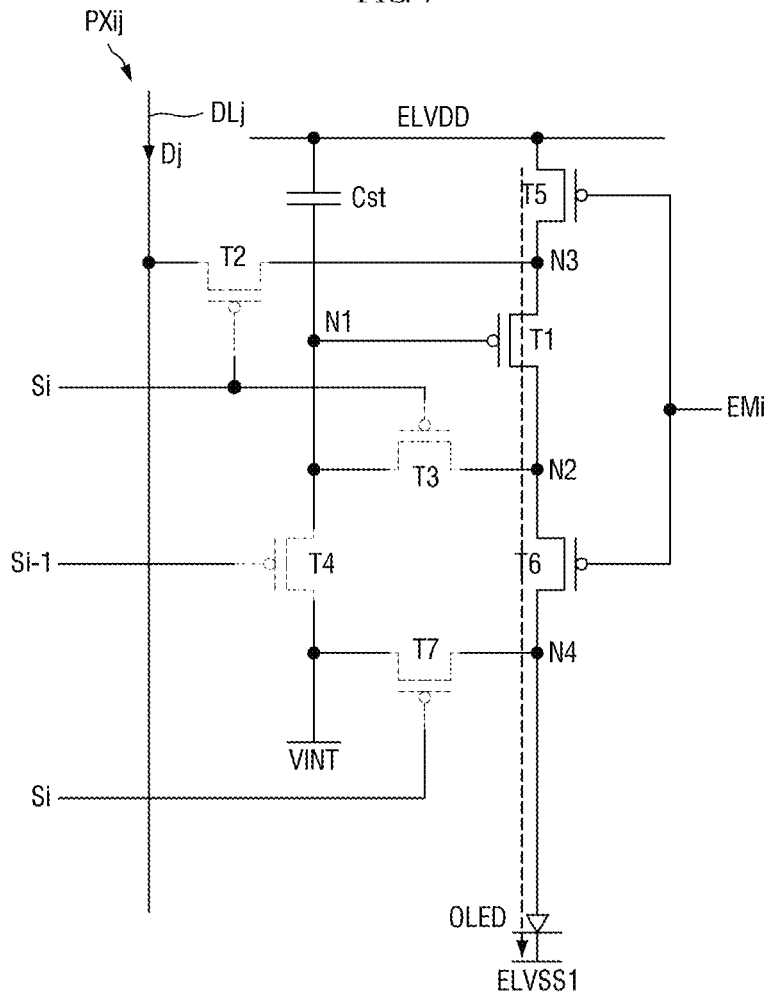
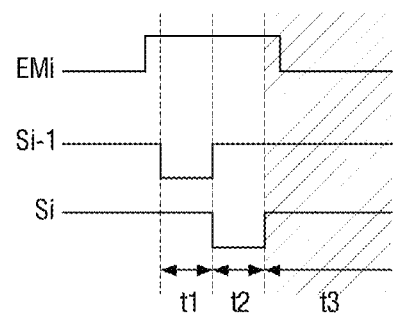

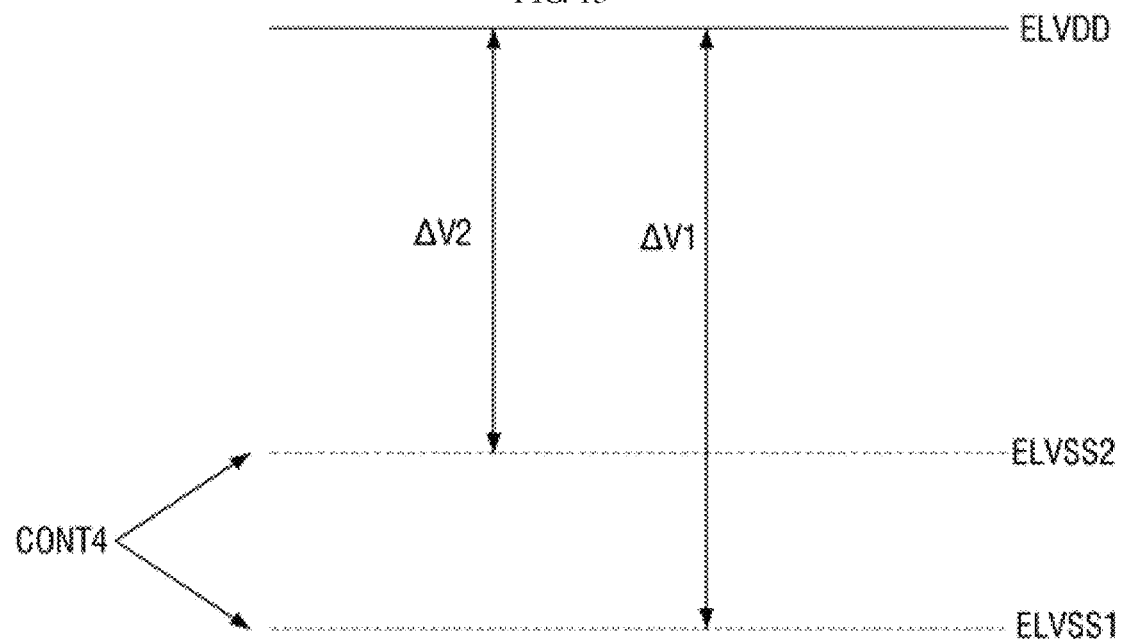

ORGANIC LIGHT-EMITTING DISPLAY DEVICE AND METHOD OF DRIVING THE SAME

CROSS-REFERENCE TO RELATED APPLICATION

This application claims priority to and the benefit of Korean Patent Application No. 10-2018-0003249, filed on Jan. 10, 2018, in the Korean Intellectual Property Office, the disclosure of which is incorporated herein by reference in its entirety.

BACKGROUND

1. Field

The present disclosure relates to an organic light-emitting display device and a method of driving the same.

2. Description of the Related Art

Display devices have become increasingly important in accordance with developments in multimedia technology. Various types of display devices such as liquid crystal display (LCD) devices, organic light-emitting display devices, etc. have been used.

Organic light-emitting display devices display an image using light-emitting diodes (OLEDs), which generate light through the recombination of electrons and holes. Organic light-emitting display devices have many advantages such as fast response speed, high luminance, wide viewing angle, and low power consumption.

SUMMARY

Exemplary embodiments of the present disclosure provide an organic light-emitting display device capable of addressing a halo phenomenon and a method of driving the organic light-emitting display device.

Exemplary embodiments of the present disclosure also provide an organic light-emitting display device capable of improving display quality and a method of driving the organic light-emitting display device.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, an organic light-emitting display device includes: a display unit including a plurality of pixel units; a timing controller is configured to calculate a black bias pixel ratio (BBPR) of the display unit based on image signals provided by an external source and to generate a control signal based on the BBPR; and a power supply unit providing a driving voltage to the display unit based on the control signal provided by the timing controller, wherein the BBPR is a ratio of a number of pixel units in a black state to a total number of pixel units in the display unit, and the power supply unit provides a first driving voltage to the display unit when the BBPR is less than a predetermined value and provides a second driving voltage, which is higher than the first driving voltage, to the display unit when the BBPR is equal to, or greater than, the predetermined value.

According to an exemplary embodiment of the present disclosure, an organic light-emitting display device comprising: a display unit including a plurality of pixel units, each of the pixel units including an organic light-emitting diode (OLED); a timing controller configured to calculate a BBPR, which is a ratio of a number of pixel units in a black state to a total number of pixel units in the display unit, and to set a driving mode based on the BBPR; and a power supply unit configured to provide a driving voltage corresponding to the set driving mode to the display unit, wherein the timing controller sets a first driving mode when the BBPR is lower than 90% and sets a second driving mode when the BBPR is 90% or higher, and the power supply unit is configured to provide a first driving voltage to a first electrode of the OLED of each of the pixel units when the first driving mode is set and to provide a second driving voltage, which is higher than the first driving voltage, to the first electrode of the OLED of each of the pixel units when the second driving mode is set.

According to an exemplary embodiment of the present disclosure a method of driving an organic light-emitting display device, includes: calculating a BBPR, which is A ratio of a number of pixel units in a black state to a total number of pixel units; generating a control signal based on the BBPR; and providing a driving voltage corresponding to the control signal to the pixel units, wherein the providing the driving voltage corresponding to the control signal, includes providing a first driving voltage to the pixel units if the BBPR is less than a reference value (e.g. a predetermined value) and providing a second driving voltage, which is higher than the first driving voltage, to the pixel units if the BBPR is greater than or equal to the reference value.

According to the aforementioned and other exemplary embodiments of the present disclosure, a halo phenomenon can be prevented.

Also, display quality can be improved, and power consumption can be reduced.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which:

FIGS. 5 through 7 are diagrams for explaining an operation of a pixel unit according to an exemplary embodiment of the present disclosure;

FIG. 13 is a diagram for explaining the selection of second and third driving voltages based on a fourth control signal;

DETAILED DESCRIPTION

Figure 1:
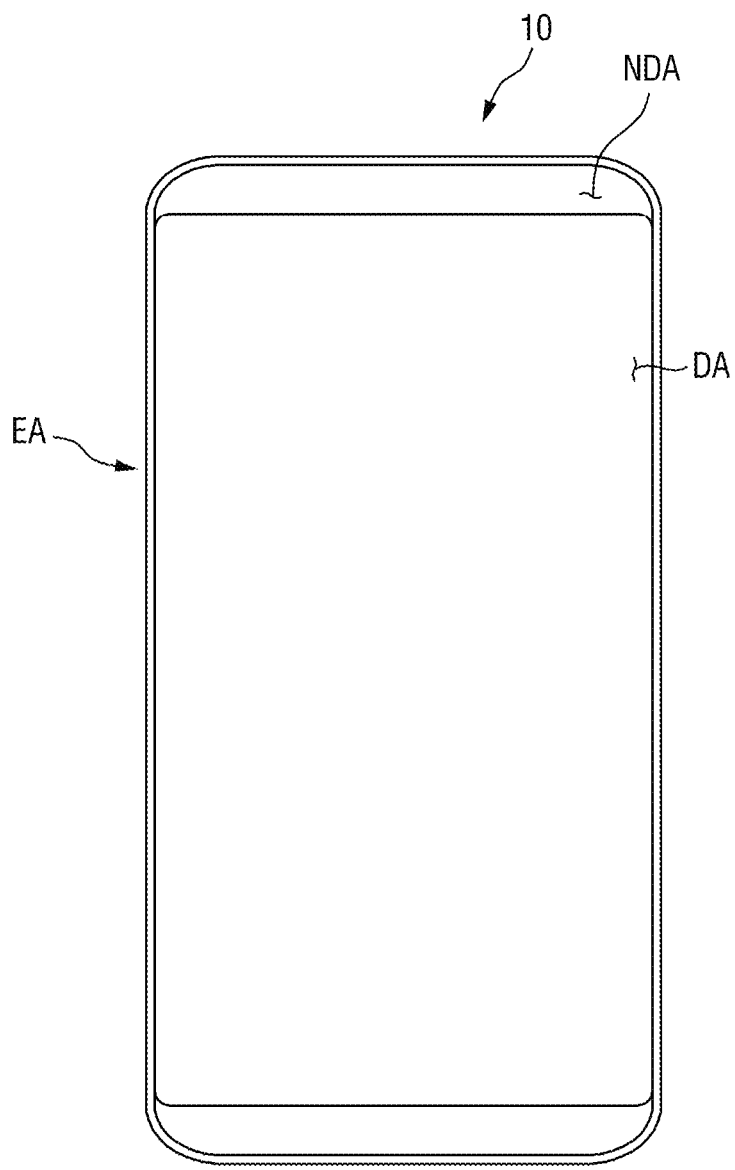
FIG. 1 is a schematic block diagram of an organic light-emitting display device according to an exemplary embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Hereinafter, exemplary embodiments will be described with reference to the accompanying drawings.

FIG. 1 is a schematic block diagram of an organic light-emitting display device according to an exemplary embodiment of the present disclosure.

Referring to FIG. 1, an organic light-emitting display device 10 may include a display area DA and a non-display area NDA.

The display area DA is defined as an area in which an image is to be displayed. The display area DA may be used as a detecting member for detecting an external environment. That is, the display area DA may be used to display an image or to recognize a fingerprint of a user. In one exemplary embodiment, the display area DA may have a flat shape, but the present disclosure is not limited thereto. Alternatively, at least a part of the display area DA may be bent or curved. The display area DA may also be provided in an edge area EA of the organic light-emitting display device 10. The edge area EA may be provided on at least one of the top, bottom, left, and right sides of the edge area DA.

The non-display area NDA is disposed on the outside of the display area DA and is defined as an area in which no image is displayed. In one exemplary embodiment, a speaker module, a camera module, and a sensor module may be disposed in the non-display area NDA. In one exemplary embodiment, the sensor module may include at least one of an illumination sensor, a proximity sensor, an infrared sensor, and an ultrasonic sensor.

Figure 2:
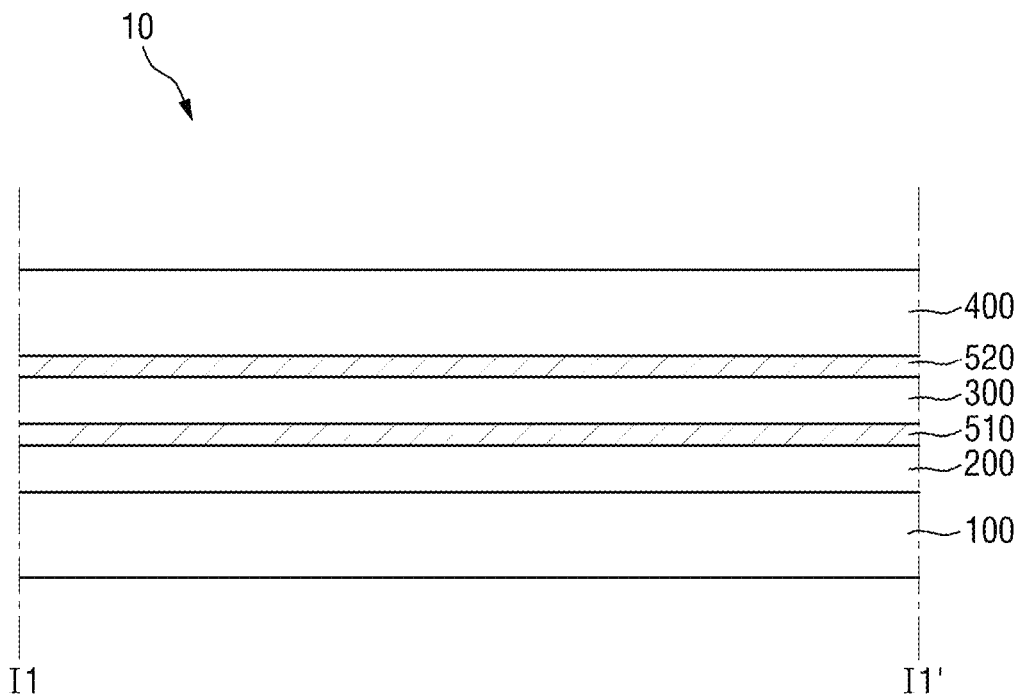
FIG. 2 is a schematic cross-sectional view taken along line I1-I1' of FIG. 1.

FIG. 2 is a schematic cross-sectional view taken along the line I1-I1' of FIG. 1.

Referring to FIG. 2, the organic light-emitting display device 10 may include a display panel 100, an input sensing layer 200, an anti-reflection panel 300, and a window panel 400. An element coupled to another element via an adhesive member will hereinafter be referred to as a panel, and an element formed together with another element by a continuous process will hereinafter be referred to as a layer. A panel may include a base layer that provides a base surface, but a layer has no base layer according to exemplary embodiments. That is, a layer refers to an element disposed on a base surface provided by another element. In one exemplary embodiment, a base layer may be a single-layer film such as a synthetic resin film or a composite film or may be a stack of a plurality of films. The base layer may include a glass substrate.

The display panel 100 is defined as a panel for displaying an image. For this, the display panel 100 includes a plurality of display elements. The plurality of display elements may be organic light-emitting diodes (OLEDs).

In one exemplary embodiment, the input sensing layer 200 may sense a finger of the user or a touch pen that is placed in contact therewith. The input sensing layer 200 may be disposed on the display panel 100. The input sensing layer 200 may be formed on the display panel 100 by a continuous process.

The anti-reflection panel 300 may reduce the reflectance of external light from above the window panel 400. The anti-reflection panel 300 may be disposed on the input sensing layer 200 and may be coupled to the input sensing layer 200 via a first adhesive member 510. In one exemplary embodiment, the anti-reflection panel 300 may include a retarder and a polarizer. The anti-reflection panel 300 may further include a black matrix and color filters.

The window panel 400 may protect the display panel 100 or the input sensing layer 200 from being scratched. The window panel 400 may be disposed on the anti-reflection panel 300 and may be coupled to the anti-reflection panel 300 via a second adhesive member 520.

The first and second adhesive members 510 and 520 may be pressure sensitive adhesives (PSAs), optically clear adhesives (OCAs), or optically clear resins (OCRs).

Alternatively to what is shown in FIG. 2, the input sensing layer 200 may be an input sensing panel, in which case the input sensing panel may be coupled to the display panel 100 via an additional adhesive member. Also, alternatively to what is shown in FIG. 2, the anti-reflection panel 300 may be an anti-reflection layer, in which case, the anti-reflection layer may be formed directly on the input sensing layer 200 without the need of an additional adhesive member.

The display panel 100 will hereinafter be described with reference to FIG. 3.

Figure 3:
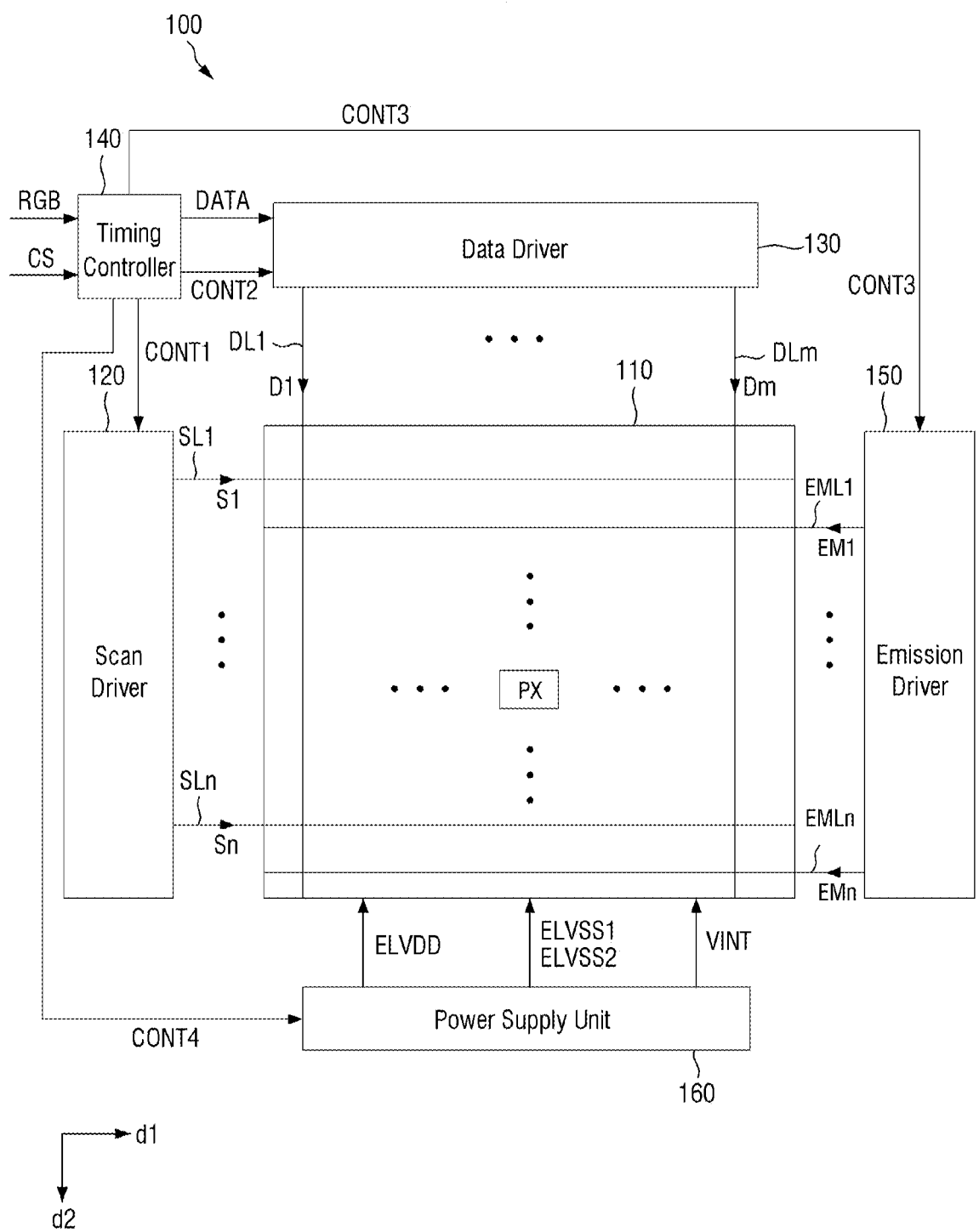
FIG. 3 is a schematic block diagram of a display panel illustrated in FIG. 2.

FIG. 3 is a schematic block diagram of the display panel illustrated in FIG. 2.

Referring to FIG. 3, the display panel 100 may include a display unit 110, a scan driver 120, a data driver 130, a timing controller 140, an emission driver 150, and a power supply unit 160.

The display unit 110 is defined as a region in which an image is to be displayed. A plurality of pixel units PX are provided in the display unit 110. The pixels PX may be connected to first through n-th scan lines SL1 through SLn (where n is a natural number not less than 1), which extend in a first direction d1, and first through m-th data lines DL1 through DLm (where m is a natural number not less than 1), which extend in a second direction d2. The pixels PX may also be connected to first through n-th emission control lines EML1 through EMLn, which extend in an opposite direction to the first direction d1, as illustrated in FIG. 3. The first direction d1 may intersect the second direction d2. The first direction d1 may be a row direction, and the second direction d2 may be a column direction. However, the directions in which the first through n-th scan lines SL1 through SLn, the first through m-th data lines DL1 through DLm, and the first through n-th emission control lines EML1 through EMLn extend are merely exemplary, and are not limited as long as the first through n-th scan lines SL1 through SLn, the first through m-th data lines DL1 through DLm, and the first through n-th emission control lines EML1 through EMLn are insulated from one another.

The scan driver 120 may be connected to the pixels PX via the first through n-th scan lines SL1 through SLn. In one exemplary embodiment, the scan driver 120 may generate first through n-th scan signals S1 through Sn based on a first control signal CONT1 provided by the timing controller 140. The scan driver 120 may provide the first through n-th scan signals S1 through Sn to the pixels PX via the first through n-th scan lines SL1 through SLn.

In one exemplary embodiment, the scan driver 120 may include a plurality of transistors and may generate the first through n-th scan signals S1 through Sn through the switching operations of the plurality of transistors. In another exemplary embodiment, the scan driver 120 may be implemented as a separate integrated circuit IC.

The data driver 130 may be connected to the pixels PX via the first through m-th data lines DL1 through DLm. In one exemplary embodiment, the data driver 130 may receive a second control signal CONT2 and image data DATA from the timing controller 140. The data driver 130 may generate first through m-th data signals D1 through Dm based on the second control signal CONT2 and the image data DATA. The data driver 130 may provide the first through m-th data signals D1 through Dm to the pixels PX via the first through m-th data lines DL1 through DLm. In one exemplary embodiment, the data driver 130 may be implemented as a separate IC and may include a shift register, a latch, and a digital-to-analog converter (DAC).

The timing controller 140 may receive image signals RGB and control signals CS from an external source. The image signals RGB may include a plurality of grayscale data to be provided to the pixels PX. In one exemplary embodiment, the control signals CS may include a horizontal synchronization signal, a vertical synchronization signal, and a main clock signal. The horizontal synchronization signal indicates the amount of time that it takes to display a single line of the display unit 110. The vertical synchronization signal indicates the amount of time that it takes to display a frame of an image. The main clock signal is a reference signal that allows the timing controller 140, the scan driver 120, and the data driver 130 to be synchronized with one another to generate various signals.

The timing controller 140 may generate the image data DATA, the first control signal CONT1, the second control signal CONT2, a third control signal CONT3, and a fourth control signal CONT4 by processing the image signals RGB and the control signals CS in accordance with operating conditions of the display unit 110. In one exemplary embodiment, the timing controller 140 may be implemented as a separate IC or may be integrated into a single IC together with the data driver 130.

The timing controller 140 may calculate the black bias pixel ratio (BBPR) of the display unit 110 based on the image signals RGB, may generate the fourth control signal CONT4 based on the BBPR of the display unit 110, and may provide the fourth control signal CONT4 to the power supply unit 160. The BBPR of the display unit 110 is defined as the ratio of the number of pixel units PX that are in a black state in each frame to the total number of pixels PX in the display unit 110.

The power supply unit 160 may control the level of each driving voltage provided to the display unit 110 based on the fourth control signal CONT4. This will be described later in detail.

The emission driver 150 may be connected to the pixels PX via the first through n-th emission control lines EML1 through EMLn. The emission driver 150 may generate first through n-th emission control signals EM1 through EMn based on the third control signal CONT3 provided by the timing controller 140. The emission driver 150 may provide the first through n-th emission control signals EM1 through EMn to the pixels PX via the first through n-th emission control lines EML1 through EMLn.

In one exemplary embodiment, the emission driver 150 may include a plurality of transistors and may generate the first through n-th emission control signals EM1 through EMn through the switching operations of the plurality of transistors. In another exemplary embodiment, the emission driver 150 may be implemented as a separate IC.

The power supply unit 160 may provide a power supply voltage ELVDD and an initialization voltage VINT to the pixels PX. Also, the power supply unit 160 may provide one of first and second driving voltages ELVSS1 and ELVSS2 to the pixels PX based on the fourth control signal CONT4 provided by the timing controller 140.

In one exemplary embodiment, the display panel 100 may be driven in one of first and second driving modes. The first driving mode corresponds to a case where the BBPR of the display unit 110 is 90% or higher, and the second driving mode corresponds to a case where the BBPR of the display unit 110 is lower than 90%. In a case where the fourth control signal CONT4 is provided in the first driving mode, the power supply unit 160 may provide the first driving voltage ELVSS1 to the display unit 110. On the other hand, in a case where the fourth control signal CONT4 is provided in the second driving mode, the power supply unit 160 may provide the second driving voltage ELVSS2 to the display unit 110. The BBPR of the display unit 110, the driving mode of the display panel 100, and the level of each driving voltage provided to the pixels PX will be described later in detail.

In one exemplary embodiment, the voltage level of the power supply voltage ELVDD may be higher than those of the first and second driving voltages ELVSS1 and ELVSS2, and the voltage level of the second driving voltage ELVSS2 may be higher than that of the first driving voltage ELVSS1. In one exemplary embodiment, the power supply unit 160 may be implemented as a separate IC.

The pixels PX will hereinafter be described, taking, as an example, a pixel unit PXij, which is electrically connected to an i-th scan line SLi (where I is a natural number of 2 or greater), an (i−1)-th scan line SLi−1, a j-th data line DLj (where j is a natural number not less than 1), and an i-th emission control line EMLi.

Figure 4:
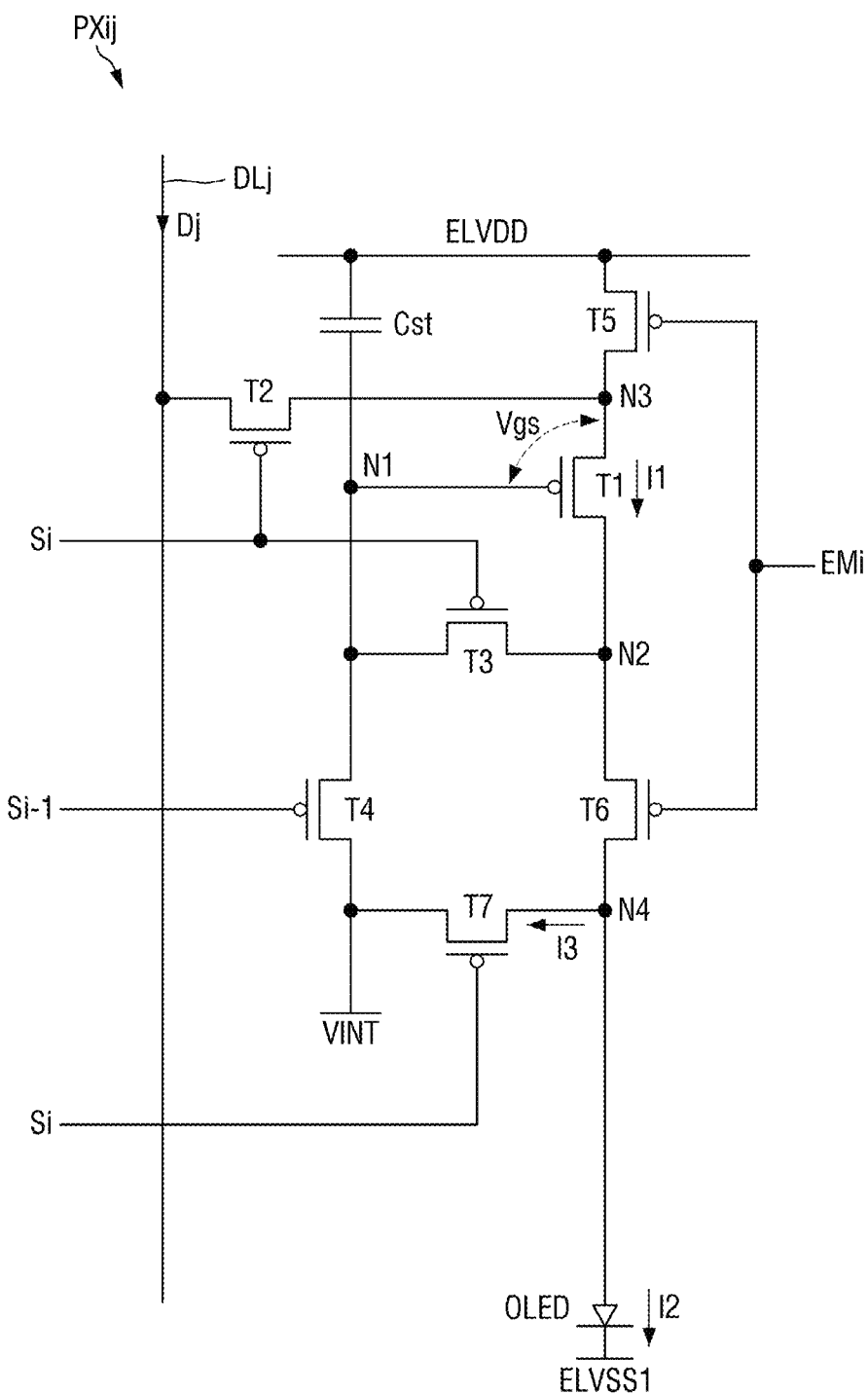
FIG. 4 is an equivalent circuit diagram of a pixel unit illustrated in FIG. 3.

FIG. 4 is an equivalent circuit diagram of a pixel unit illustrated in FIG. 3.

Referring to FIG. 4, the pixel unit PXij may include first through seventh transistors T1 through T7, a storage capacitor Cst, and an OLED "OLED".

In one exemplary embodiment, the first through seventh transistors T1 through T7 may be P-type metal oxide semiconductor (PMOS) transistors, but the present disclosure is not limited thereto. That is, in another exemplary embodiment, the first through seventh transistors T1 through T7 may be N-type metal oxide semiconductor (NMOS) transistors.

In one exemplary embodiment, the first through seventh transistors T1 through T7 may each utilize amorphous silicon, polysilicon, low-temperature polysilicon (LTPS), an oxide semiconductor, and/or an organic semiconductor as their channel layer.

In another exemplary embodiment, the channel layers of the first through seventh transistors T1 through T7 may be of different types. In one exemplary embodiment, in consideration of the functions of thin-film transistors (TFTs) or process order, at least some of the first through seventh transistors T1 through T7 may be formed to include an oxide semiconductor, and the other transistors may be formed to include LTPS.

The first through seventh transistors T1 through T7 will hereinafter be described.

The first transistor T1 may include a gate electrode connected to a first node N1, a source electrode connected to a third node N3, and a drain electrode connected to a second node N2. The second transistor T2 may include a gate electrode for receiving an i-th scan signal Si, a source electrode connected to the j-th data line DLj, and a drain electrode connected to the third node N3.

The second transistor T2 may perform a switching operation in accordance with the i-th scan signal Si and may provide a j-th data signal Dj to the source electrode of the first transistor T1 connected to the third node N3. The first transistor T1 may control a driving current I1, provided to the OLED "OLED", in accordance with the j-th data signal Dj.

In one exemplary embodiment, the first transistor T1 may control the driving current I1 in accordance with the difference in electric potential between the gate electrode and the source electrode thereof, i.e., a gate-source voltage Vgs. The first transistor T1 is turned on when the gate-source voltage Vgs is higher than a threshold voltage Vth. Then, when the voltage of the source electrode of the first transistor T1 becomes higher than the threshold voltage of the OLED "OLED", the current between the source electrode and the drain electrode of the first transistor T1, i.e., the driving current I1, is provided to the OLED "OLED". That is, the first transistor T1 may be a driving transistor, and the second transistor T2 may be a scan transistor.

The third transistor T3 may include a gate electrode provided with the i-th scan signal Si, a source electrode connected to the drain electrode of the first transistor T1, and a drain electrode connected to the gate electrode of the first transistor T1. The third transistor T3 may perform a switching operation in accordance with the i-th scan signal Si and may connect the source electrode and the gate electrode of the first transistor T1. The third transistor T3 may diode-connect the first transistor T1 through a switching operation and may thus compensate for the threshold voltage Vth of the first transistor T1. That is, the third transistor T3 may be a compensating transistor.

Once the first transistor T1 is diode-connected, a voltage lower than a voltage Vj corresponding to the j-th data signal Dj provided to the source electrode of the first transistor T1 by as much as the threshold voltage Vth of the first transistor T1 may be provided to the gate electrode of the first transistor T1. The voltage provided to the gate electrode of the first transistor T1 will hereinafter be referred to as a threshold voltage-reflected voltage Vj-Vth.

Because the gate electrode of the first transistor T1 is connected to a first electrode of the capacitor Cst, the threshold voltage-reflected voltage Vj-Vth is maintained by the storage capacitor Cst. Because the threshold voltage-reflected voltage Vj-Vth is applied to the gate electrode of the first transistor T1 and is maintained, the driving current I1 that flows in the first transistor T1 is not affected by the threshold voltage Vth of the first transistor T1. Accordingly, any deviation in the threshold voltage Vth of the first transistor T1 can be compensated for, and non-uniformity in luminance can be prevented.

The fourth transistor T4 may include a gate electrode provided with an (i-1)-th scan signal Si-1, a source electrode provided with an initialization voltage VINT, and a drain electrode connected to the first node N1. The fourth transistor T4 may perform a switching operation in accordance with the (i-1)-th scan signal Si-1 and may provide the initialization voltage VINT to the first node N1. As described above, the first node N1 is connected to the gate electrode of the first transistor T1. The (i-1)-th scan signal Si-1 is a signal provided ahead of the i-th scan signal Si.

Accordingly, the fourth transistor T4 may be turned on ahead of the second transistor T2 to provide the initialization voltage VINT to the gate electrode of the first transistor T1. The level of the initialization voltage VINT is not limited as long as the initialization voltage VINT can sufficiently lower the voltage of the gate electrode of the first transistor T1. That is, the fourth transistor T4 may be an initializing transistor.

The fifth transistor T5 may include a gate electrode provided with an i-th emission control signal EMi, a source electrode provided with the power voltage ELVDD, and a drain electrode connected to the third node N3. The fifth transistor T5 may perform a switching operation in accordance with the i-th emission control signal EMi and may provide the power supply voltage ELVDD to the source electrode of the first transistor T1, which is connected to the third node N3.

The sixth transistor T6 may include a gate electrode provided with the i-th emission control signal EMi, a source electrode connected to the second node N2, and a drain electrode connected to the fourth node N4. The sixth transistor T6 may perform a switching operation in accordance with the i-th emission control signal EMi and may form a current path via which the driving current I1 can flow toward the OLED "OLED". The OLED "OLED" may emit light in accordance with an emission current I2 corresponding to the driving current I1. That is, the fifth and sixth transistors T5 and T6 may be emission control transistors.

The seventh transistor T7 may include a gate electrode provided with the i-th scan signal Si, a source electrode provided with the initialization voltage VINT, and a drain electrode connected to the fourth node N4. Due to the initialization voltage VINT, a bypass current I3 may flow from the fourth node N4 toward the seventh transistor T7 with the seventh transistor T7 turned off.

Even in a case where a minimum current of the first transistor T1 for displaying a black image flows as the driving current I1, the black image may not be able to be properly displayed if the OLED "OLED" emits light. That is, the seventh transistor T7 may distribute some of the minimum current of the first transistor T1 to a current path other than a current path toward the OLED "OLED" as a bypass current I3.

The minimum current of the first transistor T1 refers to the current of the first transistor T1 when the first transistor T1 is turned off because of the gate-source voltage Vgs of the first transistor T1 being lower than the threshold voltage Vth of the first transistor T1. The black image may be displayed by transmitting the minimum current of the first transistor T1 to the OLED "OLED". When a minimum driving current for displaying the black image flows, the influence of the transfer of the bypass current I3 may be significant. On the other hand, when a driving current for displaying an ordinary image or a white image flows, the influence of the bypass current I3 is almost insignificant. Accordingly, when a driving current for displaying the black image flows, the emission current I2, which is lower than the driving current I1 by as much as the bypass current I3, branched off from the driving current I1, has a minimum level sufficient to properly display the black image.

Therefore, the black image can be properly displayed, and as a result, contrast ratio can be improved. That is, the seventh transistor T7 may be a bypass transistor. The seventh transistor T7 may receive the (i−1)-th scan signal Si−1, instead of the i-th scan signal Si, in which case the fourth and seventh transistors T4 and T7 may receive the (i−1)-th scan signal Si−1 and may thus perform a switching operation at the same time.

The operation of the pixel unit PXij will hereinafter be described with reference to FIGS. 5 through 7.

FIGS. 5 through 7 are diagrams for illustrating an operation of the pixel unit of FIG. 5.

Referring to FIG. 5, in a first driving period t1, the (i−1)-th scan signal Si−1 is switched from a high level to a low level, and the i-th scan signal Si and the i-th emission control signal EMi are maintained at the high level.

In response to the (i−1)-th scan signal Si−1 being switched from the high level to the low level, the fourth transistor T4 is turned on. The fourth transistor T4 may provide the initialization voltage VINT to the first node N1. The initialization voltage VINT may be set to be low enough to initialize the first node N1. In one exemplary embodiment, the initialization voltage VINT may be −3.5 V. Because the gate electrode of the first transistor T1 is electrically connected to the first node N1, the gate electrode of the first transistor T1 is set to the initialization voltage VINT.

Referring to FIG. 6, in a second driving period t2, the i-th scan signal Si is switched from the high level to the low level, the (i−1)-th scan signal Si−1 is switched from the low level to the high level, and the i-th emission control signal EMi is maintained at the high level.

Accordingly, the second, third, and seventh transistors T2, T3, and T7 are turned on, and the fourth transistor T4 is turned off. In response to the third transistor T3 being turned on, the first transistor T1 is diode-connected. The j-th data signal Dj, which is provided from the j-th data line DLj via the second transistor T2, is provided to the first node N1 via the third node N3 and the third transistor T3. Because the first transistor T1 is diode-connected, the first node N1 is provided with a differential voltage corresponding to the difference between the voltage corresponding to the j-th data signal Dj and the threshold voltage Vth of the first transistor T1. That is, the first node N1 is provided with a voltage lower than the voltage corresponding to the j-th data signal Dj by as much as the threshold voltage Vth of the first transistor T1.

The storage capacitor Cst stores electric charge corresponding to the difference between the differential voltage provided to the first node N1 and the power supply voltage ELVDD. In response to the seventh transistor T7 being turned on, the fourth node N4 is set to the initialization voltage VINT.

A third driving period t3 is defined as an emission period. Referring to FIG. 7, in the third driving period P3, the (i−1)-th scan signal Si−1 is maintained at the high level, and the i-th scan signal Si is switched from the low level to the high level. Then, the i-th emission control signal EMi is switched from the high level to the low level.

Accordingly, the fifth and sixth transistors T5 and T6 are turned on, and the second, third, and seventh transistors T2, T3, and T7 are turned off. In response to the fifth and sixth transistors T5 and T6 being turned on, the driving current I1 flows from the power supply voltage ELVDD to the OLED "OLED" via the fifth transistor T5, the first transistor T1, and the sixth transistor T6. The OLED "OLED" may emit light corresponding to the driving current I1 during the third driving period t3.

A halo phenomenon will hereinafter be described with reference to FIGS. 4, 8, and 9. The vertical axis of FIG. 9 represents a driving range (DR) of the first transistor T1.

Figure 8:
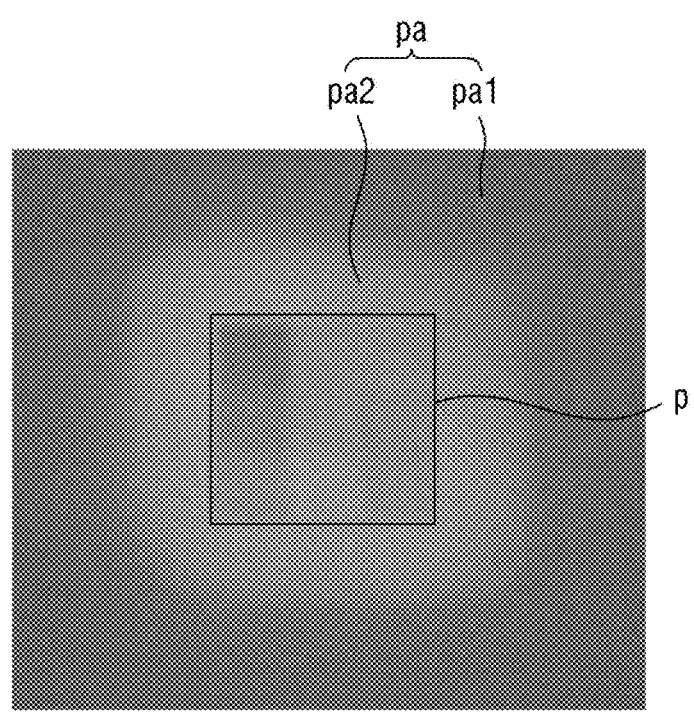
FIG. 8 is a diagram for explaining a halo phenomenon of an organic light-emitting display device.
Figure 9:
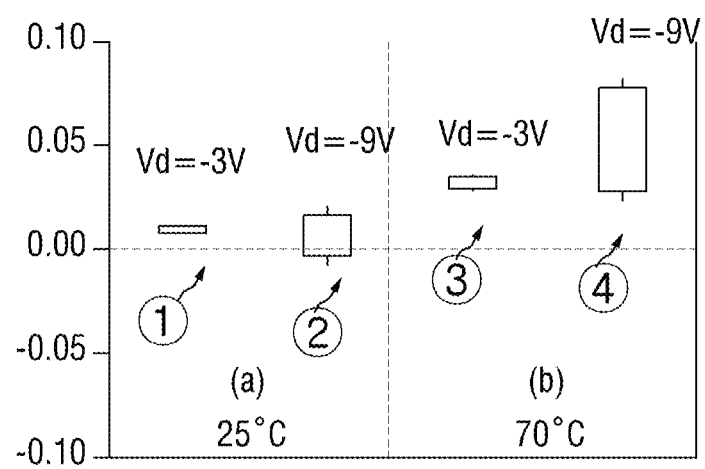
FIG. 9 is a diagram showing a driving range in accordance with black bias conditions and temperature variations.

FIG. 8 is a diagram for explaining a halo phenomenon in an organic light-emitting display device. FIG. 9 is a diagram showing a DR in accordance with black bias conditions and temperature variations.

When a high-luminance pattern p and a peripheral area pa disposed to surround the high-luminance pattern p and have a black grayscale level are driven for a long period of time, the luminance of a second area pa2, which is a part of the peripheral area pa that is relatively close to the high-luminance pattern p, may become higher than the luminance of a first area pa1, which is a part of the peripheral area pa that is relatively distant from the high-luminance pattern p, and this phenomenon is referred to as a halo phenomenon.

In the case of the first and third transistors T1 and T3 of FIG. 4, the degree of emission of the OLED "OLED", i.e., the luminance of the OLED "OLED", is directly affected by the levels of voltages applied to the electrodes of each of the first and third transistors T1 and T3. In one exemplary embodiment, the amount of current provided to the OLED "OLED" varies depending on the level of a voltage provided to the gate, source, and drain electrodes of the first transistor T1, which is a driving transistor. Because the drain and source electrodes of the third transistor T3, which is a compensating transistor, are electrically connected to the gate and drain electrodes, respectively, of the first transistor T1, the amount of current provided to the OLED "OLED" varies depending on the levels of voltages provided to the source and drain electrodes of the third transistor T3.

The difference in luminance between the first and second areas pa1 and pa2 is associated with the difference in the degree of degradation of the first and third transistors T1 and T3 of each pixel unit PX between the first and second areas pa1 and pa2, and this will hereinafter be described, taking the first transistor T1 of each pixel unit PX into account.

In order for the peripheral area pa to display a black color, a black bias needs to be applied to the first transistor T1 of each pixel unit PX in the peripheral area pa. The black bias is defined as a set of conditions for realizing a black grayscale level. The set of conditions for realizing a black grayscale level may include, for example, the level of a signal provided to the gate or drain electrode of the first transistor T1, the level of the first driving voltage ELVSS1, and the level of the second driving voltage ELVSS2.

In response to the black bias being applied to the first transistor T1 of each pixel unit PX, the degree of degradation of the first transistor T1 of each pixel unit PX increases due to black bias stress. An increase in the degree of degradation of the first transistor T1 of each pixel unit PX may be interpreted as an increase in the DR of the first transistor T1 of each pixel unit PX.

However, even if the same black bias is applied to the first transistors T1 of pixel units PX in different areas, an increase in the DR of the first transistor T1 of each pixel unit PX in the second area pa2, which is relatively close to the high-luminance pattern p, may be greater than an increase in the DR of the first transistor T1 of each pixel unit PX in the first area pa1, which is relatively distant from the high-luminance pattern p.

Referring to FIG. 9, in the same black bias conditions, the higher the temperature, the larger the DR of the first transistor T1 of each pixel unit PX, and the greater the minimum of the DR of the first transistor T1 of each pixel unit PX. In one exemplary embodiment, in the same black bias conditions, the DR of the first transistor T1 of each pixel unit PX is higher in a region (b) where the temperature is relatively higher than in a region (a) where the temperature is relatively low, and the minimum of the DR of the first transistor T1 of each pixel unit PX is greater in the region (b) than in the region (a).

The temperature of the first transistor T1 of each pixel unit PX in the high-luminance pattern p increases due to the self-heating effect of the high-luminance pattern p and may thus affect the first transistor T1 of each pixel unit PX in the second area pa2, which is close to the high-luminance pattern p. However, a variation in the DR of the first transistor T1 of each pixel unit PX, caused by the high-luminance pattern p, is almost negligible as compared to a variation in the DR of the first transistor T1 of each pixel unit PX, caused by the application of a black bias.

As already mentioned above, even in the same black bias conditions, an increase in the DR of the first transistor T1 of each pixel unit PX may be greater when the temperature is high than when the temperature is low. Thus, because an increase in the temperature of the first transistor T1 of each pixel unit PX in the second area pa2 is greater than an increase in the temperature of the first transistor T1 of each pixel unit PX in the first area pa1, the degradation of the first transistor T1 of each pixel unit PX, i.e., the variation of the DR of the first transistor T1 of each pixel unit PX, may be further accelerated. As a result, the luminance of the first area pa1 becomes different from the luminance of the second area pa2. In one exemplary embodiment, the luminance of the second area pa2 becomes higher than the luminance of the first area pa1.

In the meantime, referring again to FIG. 9, in the same temperature conditions, the DR of the first transistor T1 of each pixel unit PX is narrower when a black bias, for example, a voltage Vd applied to the drain electrode of the first transistor T1 of each pixel unit PX, is high than when the voltage Vd is low, and this means that a halo phenomenon is preventable.

Thus, the organic light-emitting display device 10 can prevent a halo phenomenon by raising the voltage Vd in predetermined conditions so as to narrow down the DR of the first transistor T1 of each pixel unit PX. Here, the predetermined conditions include a BBPR of 90% or higher, and this will hereinafter be described with reference to FIGS. 10 and 13.

Figure 10:
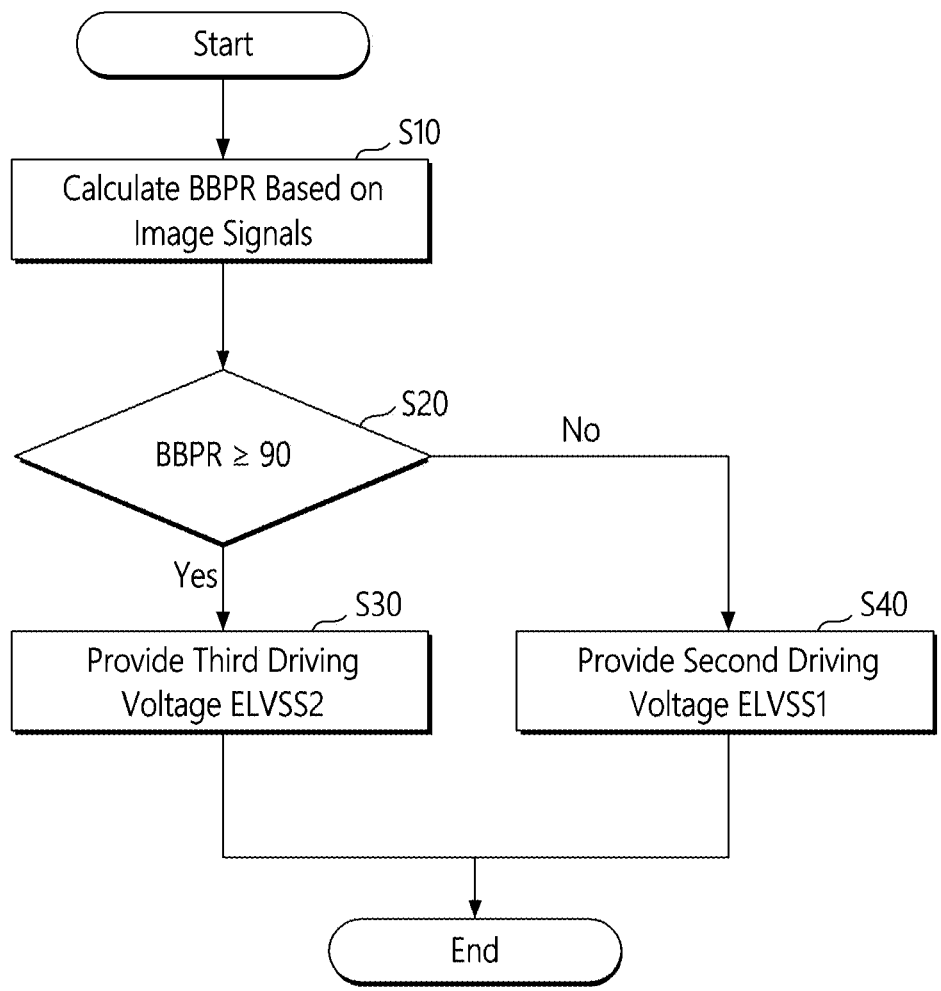
FIG. 10 is a flowchart illustrating a method of driving an organic light-emitting display device according to an exemplary embodiment of the present disclosure.
Figure 11:
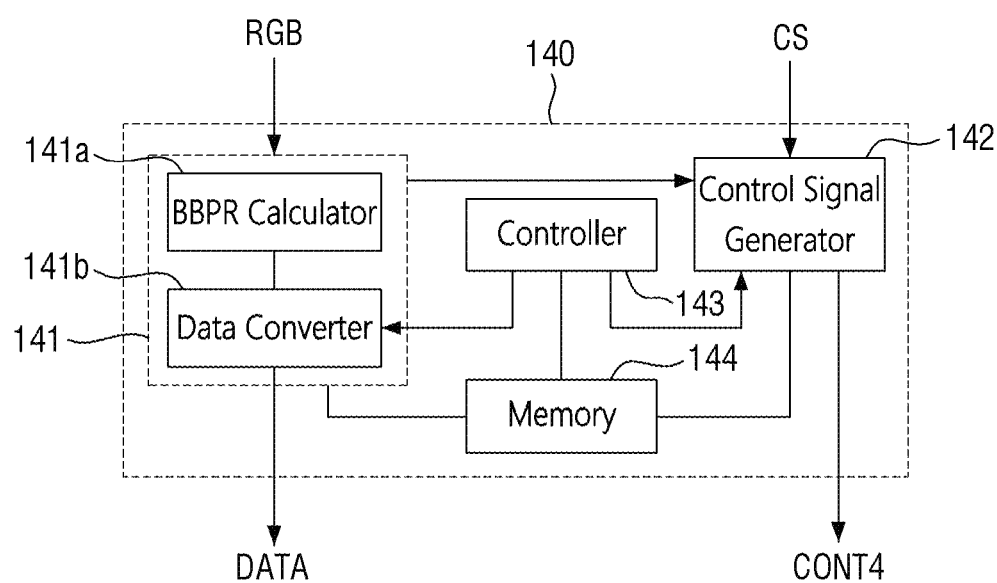
FIG. 11 is a detailed block diagram of a timing controller illustrated in FIG. 3.
Figure 12A:
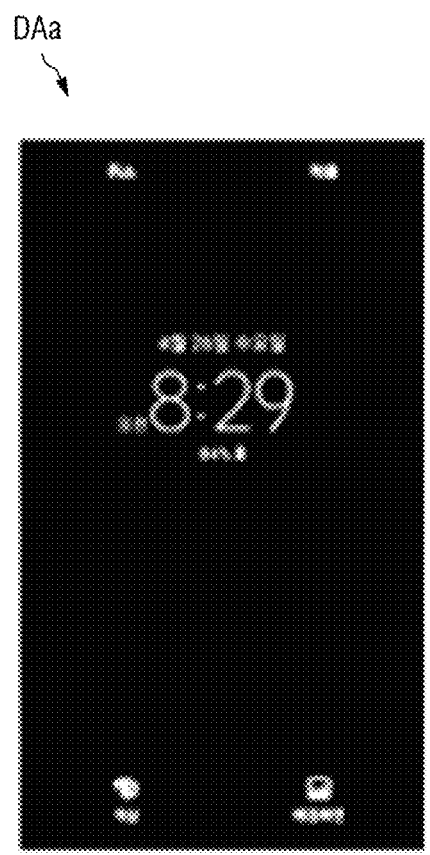
FIG. 12A is a diagram showing an exemplary case where the black bias pixel ratio (BBPR) of a display unit is 90% or higher.
Figure 12B:
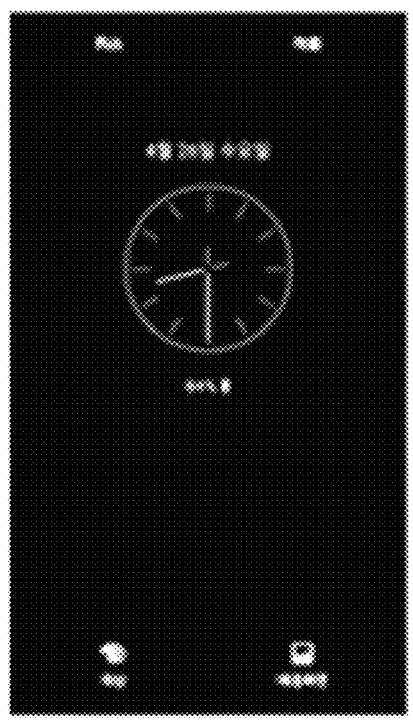
FIG. 12B is a diagram showing an exemplary case where the black bias pixel ratio (BBPR) of a display unit is 90% or higher.

FIG. 10 is a flowchart illustrating a method of driving an organic light-emitting display device according to an exemplary embodiment of the present disclosure. FIG. 11 is a detailed block diagram of the timing controller illustrated in FIG. 3. FIG. 12A and FIG. 12B are diagrams showing an exemplary cases where the BBPR of the display unit 110 is 90% or higher. FIG. 13 is a diagram for explaining the selection of second and third driving voltages based on a fourth control signal. The method of driving an organic light-emitting display device according to an exemplary embodiment of the present disclosure will hereinafter be described with reference not only to FIGS. 10 through 13, but also to FIGS. 3, 4 and 9.

The timing controller 140 calculates the BBPR of the display unit 110 based on the image signals RGB (S10). Thereafter, the timing controller 140 determines whether the BBPR of the display unit 110 is 90% or higher.

In one exemplary embodiment, the timing controller 140 may include an image data generator 141, a control signal generator 142, a controller 143, and a memory 144.

The image data generator 141 may include a BBPR calculator 141a and a data converter 141b.

The BBPR calculator 141a may calculate the BBPR of the display unit 110 based on the image signals RGB. The BBPR calculator 141a may provide the calculated BBPR to the control signal generator 142. The BBPR calculator 141a may also provide the calculated BBPR to the memory 144.

In one exemplary embodiment, the BBPR calculator 141a may calculate the on-pixel ratio (OPR) of the display unit 110 first by adding up a number of pixel units PX that emit light in a given frame and dividing the number of pixel units PX that emit light in the given frame by the resolution of the display panel 100. That is, the OPR of the display unit 110 is defined as the ratio of the number of pixel units PX emitting light in an "on" state in any given frame to the total number of pixel units PX in the display unit 110.

In one exemplary embodiment, the BBPR calculator 141a may calculate an individual OPR for each group of pixel units PX that emit a first color (for example, a red color), a second color (for example, a green color), or a third color (for example, a blue color). In another exemplary embodiment, the BBPR calculator 141a may calculate an integrated OPR by adding up the image signals RGB for all the pixel units PX that display various colors. Then, the BBPR calculator 141a may calculate the BBPR of the display unit 110 by subtracting the calculated OPR from a value of 100.

The data converter 141b may generate the image data DATA based on the image signals RGB and may provide the image data DATA to the data driver 130.

The control signal generator 142 may generate the first, second, third, and fourth control signals CONT1, CONT2, CONT3, and CONT4 based on the control signals CS and may provide the first, second, third, and fourth control signals CONT1, CONT2, CONT3, and CONT4 to the scan driver 120, the data driver 130, the emission driver 140, and the power supply unit 160, respectively. The control signal generator 142 may generate the fourth control signal CONT4 based on the BBPR calculated by the BBPR calculator 141a.

In one exemplary embodiment, in the first driving mode where the BBPR of the display unit 110 is lower than 90%, the control signal generator 142 may provide a fourth control signal CONT4 for generating the first driving voltage ELVSS1 to the power supply unit 160. The power supply unit 160 may generate the first driving voltage ELVSS1 based on the fourth control signal for generating the first driving voltage ELVSS1 and may provide the first driving voltage ELVSS1 to the pixel units PX (S40). In one exemplary embodiment, the first driving voltage ELVSS1 may have a level of about −4V.

On the other hand, in the second driving mode where the BBPR of the display unit 110 is 90% or higher, the control signal generator 142 may provide a fourth control signal CONT4 for generating the second driving voltage ELVSS2 to the power supply unit 160. Referring to FIGS. 12A and 12B, the second driving mode may correspond to a case where a display area DAa or DAb is operated in an always-on display (AOD) mode. In a case where the display area DAa or DAb is operated in the AOD mode, particular information may be displayed in the display area DA even when the organic light-emitting display device 10 is not in use. In one exemplary embodiment, the particular information may include time information, date information, battery state information, and message alarm information. However, the second driving mode is not limited to the AOD mode as long as the BBPR of the display unit 110 is 90% or higher.

In the second driving mode, the power supply unit 160 may provide the second driving voltage ELVSS2, which is generated based on the fourth control signal CONT2 for generating the second driving voltage ELVSS2, to the pixel units PX (S30).

As already mentioned above, because the second driving voltage ELVSS2 is higher than the first driving voltage ELVSS1, the pixel units XP are provided with a relatively high voltage, i.e., the second driving voltage ELVSS2, in the second driving mode, and this will hereinafter be described later with reference to FIG. 13.

The power supply unit 160 may provide one of the first and second driving voltages ELVSS1 and ELVSS2 to the display unit 110 as a driving voltage in accordance with the fourth control signal CONT4. When the first driving voltage ELVSS1 is provided to the display unit 110, a power supply voltage difference $\Delta V1$ is determined by the difference between the power supply voltage ELVDD and the first driving voltage ELVSS1. On the other hand, when the second driving voltage ELVSS2 is provided to the display unit 110, a power supply voltage difference $\Delta V2$ is determined by the difference between the power supply voltage ELVDD and the second driving voltage ELVSS2.

That is, the power supply unit 160 may control a power supply voltage difference with the power supply voltage ELVDD by providing one of the first and second driving voltages ELVSS1 and ELVSS2. As a result, the power consumption of the organic light-emitting display device 10 can be reduced.

As already mentioned above with reference to FIG. 9, in any given temperature conditions, the DR of the first transistor T1 of each pixel unit PX is narrower when a black bias, for example, the voltage Vd, which is a voltage applied to the drain electrode of the first transistor T1 of each pixel unit PX, is high than when the voltage Vd is low. The voltage Vd is determined by whichever of the first and second driving voltages ELVSS1 and ELVSS2 is provided by the power supply unit 160.

The organic light-emitting display device 10 can apply a high voltage to the drain electrode of the first transistor T1 of each pixel unit PX by providing a relatively high driving voltage, i.e., the second driving voltage ELVSS2, in the second driving mode. Accordingly, in the second driving mode, the DR of the first transistor T1 of each pixel unit PX is reduced, thereby lowering the degree of degradation of the first transistor T1 of each pixel unit PX and any luminance difference. That is, a halo phenomenon can be prevented.

The difference between the first and second driving voltages ELVSS1 and ELVSS2 may be greater than the difference between the level of a data signal for realizing the high-luminance pattern p of FIG. 8 and the level of a data signal for realizing a black grayscale level. In one exemplary embodiment, the difference between the first and second driving voltages ELVSS1 and ELVSS2 may be greater than the difference between a black grayscale voltage Vblack and a white grayscale voltage Vwhite. For example, when there are a total of 256 grayscale levels ranging from 0 to 255, the black grayscale voltage Vblack is defined as a voltage necessary for realizing a black grayscale level of 0, and the white grayscale voltage Vwhite is defined as a voltage necessary for realizing a white grayscale level of 255.

In one exemplary embodiment, the black grayscale voltage Vblack may be about 6.5 V, and the white grayscale voltage Vwhite may be about 3 V. Accordingly, the difference between the first and second driving voltages ELVSS1 and ELVSS2 may be greater than 3.5V. In one exemplary embodiment, the difference between the first and second driving voltages ELVSS1 and ELVSS2 may be about 4 V, and the second driving voltage ELVSS2 may be about 0 V.

A determination can be made by the BBPR calculator 141a, rather than by the control signal generator 142, as to whether the BBPR of the display unit 110 is 90% or higher. Also, the BBPR of the display unit 110 is not calculated by inverse calculation performed after the calculation of the OPR of the display unit 110. That is, alternatively, the BBPR calculator 141a may directly calculate the BBPR of the display unit 110 by calculating the ratio of the number of pixel units PX in a black state to the total number of pixel units PX in the display unit 110.

The controller 143 controls overall operations of the timing controller 140. The controller 143 may control the operations of the image data generator 141, the control signal generator 142, and the memory 144 by transmitting and receiving control signals. In one exemplary embodiment, the controller 143 may be a micro-controller unit (MCU).

In one exemplary embodiment, the memory 144 may store device information, including the resolution, the driving frequency, and timing information of the display unit 110, and compensation information for generating compensated data. Also, the memory 144 may store the BBPR provided by the image data generator 141, for example, the BBPR calculator 141a.

An organic light-emitting display device according to another exemplary embodiment of the present disclosure will hereinafter be described, avoiding any redundant descriptions of the exemplary embodiments of FIGS. 1 through 13.

Figure 14:
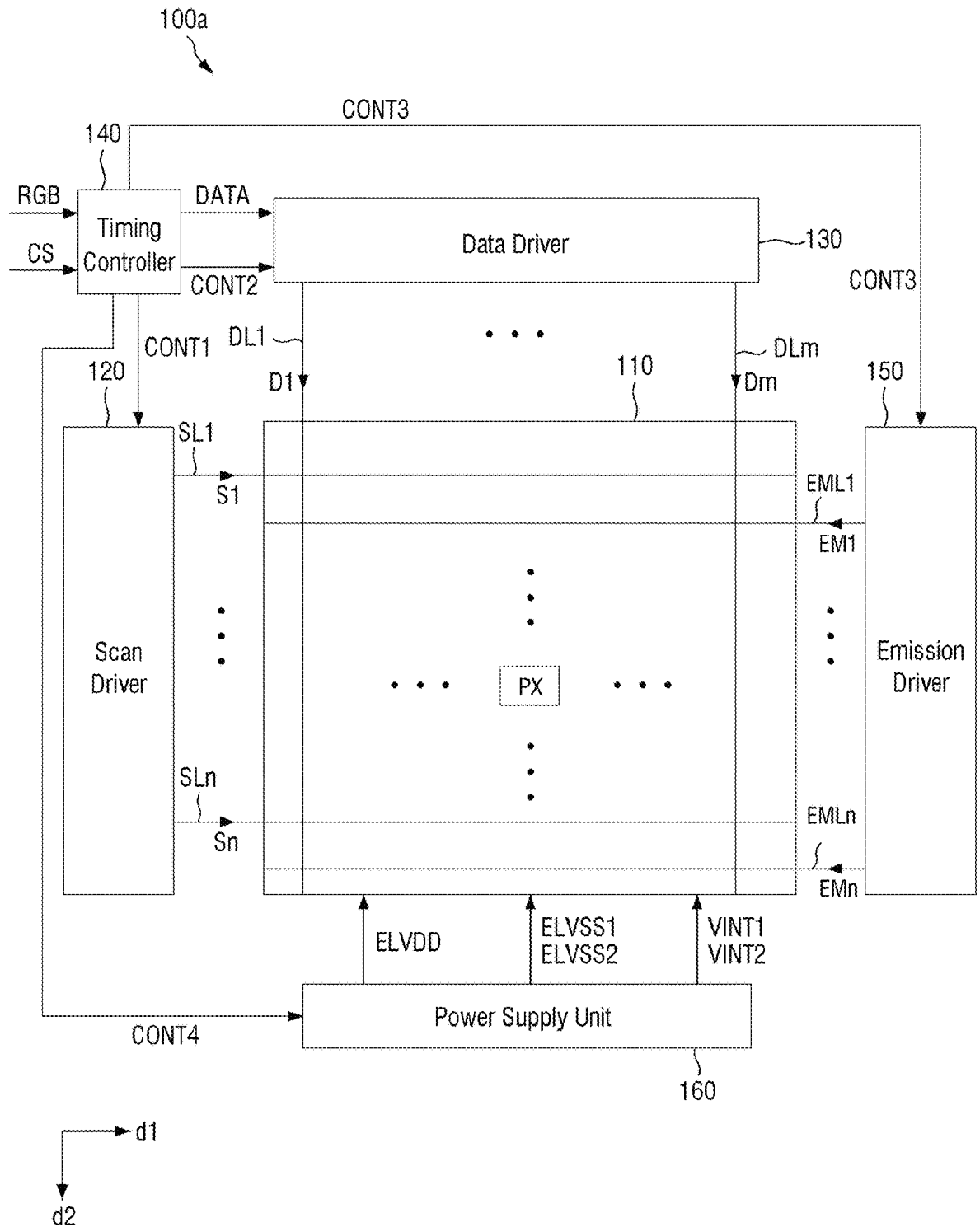
FIG. 14 is a schematic block diagram of a display panel according to an exemplary embodiment of the present disclosure.
Figure 15:
FIG. 15 is a diagram for explaining the selection of first and second initialization voltages based on the fourth control signal.

FIG. 14 is a schematic block diagram of a display panel according to an exemplary embodiment of the present disclosure. FIG. 15 is a diagram for explaining the selection of first and second initialization voltages based on the fourth control signal.

A display panel 100a of FIGS. 14 and 15 differs from the display panel 100 of FIG. 3 in that a power supply unit 160 provides first and second initialization voltages VINT1 and VINT2 to a display unit 110.

In one exemplary embodiment, referring to FIGS. 14 and 15, in a first driving mode, the power supply unit 160 may provide the first initialization voltage VINT1 to the display unit 110 based on a fourth control signal CONT4. In a second driving mode, the power supply unit 160 may provide the second initialization voltage VINT2 to the display unit 110 based on the fourth control signal CONT4. The second initialization voltage VINT2 may be higher than the first initialization voltage VINT. In one exemplary embodiment, the first initialization voltage VINT1 may be about −3.5 V, and the second initialization voltage VINT2 may be about 0.5 V.

The second initialization voltage VINT2 may be provided to the gate electrode of a first transistor T1 of each pixel unit PX in the second driving mode where the BBPR of the display unit 110 is 90% or higher. That is, a halo phenomenon can be prevented by varying the voltage applied to the gate electrode of the first transistor T1 of each pixel unit PX, among other black bias conditions.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light-emitting display device comprising:
   a display unit comprising a plurality of pixel units;
   a timing controller configured to calculate a black bias pixel ratio (BBPR) of the display unit based on an image signal provided by an external source and to generate a control signal based on the BBPR; and
   a power supply unit configured to provide a driving voltage to the display unit based on the control signal provided by the timing controller,
   wherein:
   the BBPR is a ratio of a number of pixel units in a black state to a total number of pixel units in the display unit, and
   the power supply unit is configured to provide a first driving voltage to the display unit when the BBPR is less than a reference value and to provide a second driving voltage to the display unit when the BBPR is greater than or equal to the reference value, wherein the second driving voltage is higher than the first driving voltage,
   wherein a difference between the first and second driving voltages is greater than a difference between a black grayscale voltage and a white grayscale voltage.

2. The organic light-emitting display device of claim 1, wherein the difference between the first and second driving voltages is greater than 3.5 V.

3. The organic light-emitting display device of claim 1, wherein the reference value is 90%.

4. The organic light-emitting display device of claim 3, wherein the display unit is operated in an always-on display (AOD) mode when the BBPR is 90% or higher.

5. The organic light-emitting display device of claim 1, wherein the timing controller calculates the BBPR based on an on-pixel ratio (OPR), wherein the OPR is a ratio of a number of pixel units emitting light to the total number of pixel units in the display unit.

6. The organic light-emitting display device of claim 5, wherein the OPR is calculated for each group of pixel units emitting the same color of light, from among the plurality of pixel units.

7. The organic light-emitting display device of claim 1, wherein the power supply unit is configured to provide a first initialization voltage to the display unit when the BBPR is less than the reference value and is configured to provide a second initialization voltage to the display unit when the BBPR is greater than or equal to the reference value, wherein the second initialization voltage is higher than the first initialization voltage.

8. An organic light-emitting display device comprising:
   a display unit comprising a plurality of pixel units, each of the pixel units comprising an organic light-emitting diode (OLED);
   a timing controller is configured to calculate a BBPR and set a driving mode based on the BBPR, wherein the BBPR is a ratio of a number of pixel units in a black state to a total number of pixel units in the display unit; and
   a power supply unit is configured to provide a driving voltage corresponding to the set driving mode to the display unit,
   wherein
   the timing controller is configured to set a first driving mode when the BBPR is lower than 90% and to set a second driving mode when the BBPR is 90% or higher, and
   the power supply unit is configured to provide a first driving voltage to a first electrode of the OLED of each of the pixel units when the first driving mode is set and is configured to provide a second driving voltage to the first electrode of the OLED of each of the pixel units when the second driving mode is set, wherein the second driving voltage is higher than the first driving voltage.

9. The organic light-emitting display device of claim 8, wherein a difference between the first and second driving voltages is greater than a difference between a black grayscale voltage and a white grayscale voltage.

10. The organic light-emitting display device of claim 8, wherein the difference between the first and second driving voltages is less than 3.5 V.

11. The organic light-emitting display device of claim 8, wherein a difference between the first and second driving voltages is greater than 3.5 V.

12. The organic light-emitting display device of claim 8, wherein each of the pixel units further comprises:
   a driving transistor comprising a first electrode electrically connected to the OLED; and
   a compensating transistor electrically connected to the first electrode and a control electrode of the driving transistor.

13. The organic light-emitting display device of claim 8, wherein the timing controller is configured to calculate the BBPR based on an on-pixel ratio (OPR), wherein the OPR is a ratio of a number of pixel units emitting light to the total number of pixel units in the display unit.

14. The organic light-emitting display device of claim 8, wherein the second driving mode is an AOD mode.

15. The organic light-emitting display device of claim 8, wherein the power supply unit is configured to provide a first initialization voltage to the display unit in the first driving mode and to provide a second initialization voltage to the display unit in the second driving mode, wherein the second initialization voltage is higher than the first initialization voltage.

16. A method of driving an organic light-emitting display device, comprising:
   calculating a BBPR, which is a ratio of a number of pixel units in a black state to a total number of pixel units;
   generating a control signal based on the BBPR; and
   providing a driving voltage corresponding to the control signal to the pixel units,
   wherein the providing the driving voltage corresponding to the control signal, comprises providing a first driving voltage to the pixel units when the BBPR is less than a reference value and providing a second driving voltage to the pixel units when the BBPR is greater than or equal to the reference value, wherein the second driving voltage is higher than the first driving voltage,
   wherein a difference between the first and second driving voltages is greater than a difference between a black grayscale voltage and a white grayscale voltage.

17. The method of claim 16, wherein the reference value is 90%.

18. The method of claim 16, wherein the calculating the BBPR, comprises calculating the BBPR based on an OPR, wherein the OPR is a ratio of a number of pixel units emitting light to the total number of pixel units.

* * * * *